United States Patent
Mayberry et al.

(10) Patent No.: US 10,766,097 B2
(45) Date of Patent: Sep. 8, 2020

(54) INTEGRATION OF ULTRASONIC ADDITIVE MANUFACTURED THERMAL STRUCTURES IN BRAZEMENTS

(71) Applicant: Raytheon Company, Waltham, MA (US)

(72) Inventors: Travis L. Mayberry, Dallas, TX (US); James A. Pruett, Allen, TX (US); Craig H. McCordic, Medfield, MA (US); David H. Altman, Framingham, MA (US)

(73) Assignee: Raytheon Company, Waltham, MA (US)

( * ) Notice: Subject to any disclaimer, the term of this patent is extended or adjusted under 35 U.S.C. 154(b) by 143 days.

(21) Appl. No.: 15/486,724

(22) Filed: Apr. 13, 2017

(65) Prior Publication Data

US 2018/0297144 A1 Oct. 18, 2018

(51) Int. Cl.
B23K 20/10 (2006.01)
B33Y 10/00 (2015.01)
(Continued)

(52) U.S. Cl.
CPC ............ *B23K 20/10* (2013.01); *B23K 20/103* (2013.01); *B23K 20/106* (2013.01); *B23K 20/22* (2013.01);
(Continued)

(58) Field of Classification Search
CPC . F28D 9/00; F28D 9/02; F28D 9/0081; F28D 9/0093; F28D 3/02; F28F 3/04;
(Continued)

(56) References Cited

U.S. PATENT DOCUMENTS 4,577,678 A * 3/1986 Frauenfeld ............ F28D 19/042
165/10

5,773,886 A * 6/1998 Rostoker ................... F28F 3/02
165/80.3
(Continued)

FOREIGN PATENT DOCUMENTS

CA 2916167 A1 * 12/2014 ............. F28F 19/00
DE 10304077 A1 * 8/2004 ........... F28D 9/0081
(Continued)

OTHER PUBLICATIONS

Mechanism of weld formation during very-high-powerultrasonic additive manufacturing of Al alloy 6061—Shimizu et al. (May 2014) (Year: 2014).*
(Continued)

*Primary Examiner* — Len Tran
*Assistant Examiner* — Jenna M Hopkins
(74) *Attorney, Agent, or Firm* — Renner, Otto, Boisselle & Sklar, LLP

(57) ABSTRACT

A manifold structure has at least one flow passage and a center manifold section that has at least one machined cavity. The manifold structure includes a plurality of ultrasonically additively manufactured (UAM) finstock layers arranged in the flow passage. After the finstock is formed by UAM, the finstock is permanently joined to the center manifold section via a brazing or welding process. Using UAM and a permanent joining process enables joining of the UAM finstock having enhanced thermal features to a vacuum brazement structure. UAM enables the finstock to be formed of dissimilar metal materials or multi-material laminate materials. UAM also enables bond joints of the finstock to be arranged at angles greater than ten degrees relative to a horizontal axis by using the same aluminum material in the UAM process and in the vacuum brazing process.

8 Claims, 3 Drawing Sheets

(51) Int. Cl.
| | |
|---|---|
| *B33Y 80/00* | (2015.01) |
| *F28F 3/08* | (2006.01) |
| *F28F 9/02* | (2006.01) |
| *F28F 21/08* | (2006.01) |
| *B23P 15/26* | (2006.01) |
| *F28F 3/06* | (2006.01) |
| *F28F 3/12* | (2006.01) |
| *F28D 9/00* | (2006.01) |
| *F28F 3/02* | (2006.01) |
| *B23K 20/22* | (2006.01) |
| *F28F 3/04* | (2006.01) |
| *H05K 7/20* | (2006.01) |
| *B23K 20/233* | (2006.01) |
| *B23K 101/14* | (2006.01) |
| *B23K 103/10* | (2006.01) |

(52) U.S. Cl.
CPC .......... *B23K 20/2336* (2013.01); *B23P 15/26* (2013.01); *B33Y 10/00* (2014.12); *B33Y 80/00* (2014.12); *F28D 9/0081* (2013.01); *F28F 3/02* (2013.01); *F28F 3/04* (2013.01); *F28F 3/048* (2013.01); *F28F 3/06* (2013.01); *F28F 3/08* (2013.01); *F28F 3/12* (2013.01); *F28F 9/02* (2013.01); *F28F 21/08* (2013.01); *F28F 21/084* (2013.01); *H05K 7/20163* (2013.01); *H05K 7/20254* (2013.01); *B23K 2101/14* (2018.08); *B23K 2103/10* (2018.08); *F28F 21/085* (2013.01); *F28F 2250/106* (2013.01); *F28F 2255/00* (2013.01); *F28F 2255/06* (2013.01); *F28F 2275/04* (2013.01)

(58) Field of Classification Search
CPC ........ F28F 3/08; F28F 3/12; F28F 3/48; F28F 3/02; F28F 3/048; F28F 9/02; F28F 9/0093; F28F 2250/106; H05K 7/20154; H05K 7/20254; H05K 7/20163; B23K 20/00; B23K 20/2336; B23K 20/10–106; B23K 20/103; B23K 2103/08; B23K 2103/10; B33Y 10/00; B33Y 80/10
USPC .................................. 361/699; 228/175, 176
See application file for complete search history.

(56) References Cited

U.S. PATENT DOCUMENTS

| | | | | |
|---|---|---|---|---|
| 7,331,381 | B2* | 2/2008 | Wang | F28D 7/10 165/166 |
| 7,584,781 | B2* | 9/2009 | Lai | F28F 3/086 165/166 |
| 8,256,236 | B2* | 9/2012 | Lofy | B60N 2/5657 62/150 |
| 8,575,518 | B2* | 11/2013 | Walsh | F24H 3/002 219/217 |
| 9,121,414 | B2* | 9/2015 | Lofy | F04D 29/4226 |
| 9,984,955 | B1* | 5/2018 | Liang | F28F 9/001 |
| 10,302,371 | B2* | 5/2019 | Kadijk | F28F 3/022 |
| 2003/0024693 | A1 | 2/2003 | Petty et al. | |
| 2004/0118553 | A1* | 6/2004 | Krassowski | C04B 41/009 165/104.26 |
| 2006/0048931 | A1* | 3/2006 | Dierbeck | F28D 1/05383 165/181 |
| 2006/0102696 | A1* | 5/2006 | Graham | B23K 35/002 228/101 |
| 2006/0268518 | A1* | 11/2006 | Edward | H05K 7/20154 361/695 |
| 2006/0289147 | A1* | 12/2006 | Zuo | F28D 15/0266 165/104.26 |
| 2006/0291165 | A1* | 12/2006 | Flesch | H01L 23/473 361/699 |
| 2009/0101321 | A1* | 4/2009 | Ostersetzer | F28F 3/02 165/164 |
| 2010/0065247 | A1* | 3/2010 | Meyer, IV | F28D 15/0233 165/80.3 |
| 2010/0181051 | A1* | 7/2010 | Huang | F28F 13/185 165/133 |
| 2010/0186820 | A1* | 7/2010 | Schon | F28D 15/043 136/259 |
| 2010/0193498 | A1* | 8/2010 | Walsh | F24H 3/002 219/217 |
| 2011/0114289 | A1* | 5/2011 | Altman | F28F 3/12 165/80.4 |
| 2011/0192027 | A1* | 8/2011 | Campbell | H01L 23/3677 29/890.03 |
| 2012/0006523 | A1* | 1/2012 | Masahiro | B21C 23/14 165/185 |
| 2012/0067056 | A1* | 3/2012 | Palmer | F02C 3/34 60/774 |
| 2013/0250519 | A1* | 9/2013 | Zaffetti | H05K 7/20509 361/702 |
| 2014/0008350 | A1* | 1/2014 | Becker | H05B 3/02 219/553 |
| 2014/0046248 | A1* | 2/2014 | Fini | A61M 1/166 604/29 |
| 2014/0246183 | A1* | 9/2014 | Loebig | F28D 9/0068 165/166 |
| 2014/0369054 | A1* | 12/2014 | Tsou | F28F 3/06 362/373 |
| 2014/0369055 | A1* | 12/2014 | Tsou | F28F 3/02 362/373 |
| 2015/0007969 | A1* | 1/2015 | Pal | F28F 3/02 165/166 |
| 2015/0021002 | A1* | 1/2015 | Hoglund | F28F 3/046 165/133 |
| 2015/0027679 | A1* | 1/2015 | Singh | B23K 1/008 165/182 |
| 2015/0083369 | A1* | 3/2015 | Fryer | B23K 20/24 165/104.19 |
| 2015/0137412 | A1 | 5/2015 | Schalansky | |
| 2015/0159967 | A1* | 6/2015 | Furumura | F28F 3/08 165/76 |
| 2015/0168082 | A1* | 6/2015 | Huang | F28D 15/0233 165/185 |
| 2015/0290711 | A1* | 10/2015 | Norfolk | B23K 20/103 425/78 |
| 2015/0316326 | A1* | 11/2015 | Choi | F02M 21/0215 165/166 |
| 2015/0352661 | A1 | 12/2015 | Karlen et al. | |
| 2015/0369499 | A1* | 12/2015 | Wang | F24F 6/025 349/61 |
| 2016/0079639 | A1* | 3/2016 | Pinon | H01M 10/6556 429/120 |
| 2016/0187081 | A1* | 6/2016 | Remsburg | H01L 21/30655 165/185 |
| 2016/0190038 | A1* | 6/2016 | Koyama | H05K 7/20927 257/693 |
| 2016/0263703 | A1* | 9/2016 | Eldred | F28F 21/084 |
| 2016/0290728 | A1* | 10/2016 | Coteus | H01L 23/473 |
| 2016/0338222 | A1* | 11/2016 | Reeves | H01L 21/4878 |
| 2017/0014941 | A1* | 1/2017 | Nanbu | B23K 20/24 |
| 2017/0157723 | A1* | 6/2017 | Moro-Le-Gall | F28D 9/0093 |
| 2017/0181317 | A1* | 6/2017 | Wan | F28F 3/12 |
| 2017/0287810 | A1* | 10/2017 | Morikawa | B22F 3/16 |
| 2017/0304964 | A1* | 10/2017 | Andersen | B23K 20/103 |
| 2017/0361540 | A1* | 12/2017 | Li | B29C 65/8215 |
| 2018/0065206 | A1* | 3/2018 | Mennucci | B23K 20/00 |
| 2018/0066893 | A1* | 3/2018 | Bing | F28F 9/02 |
| 2018/0073813 | A1* | 3/2018 | Ranjan | B32B 3/266 |
| 2018/0087842 | A1* | 3/2018 | Chainer | H01L 23/473 |
| 2018/0087846 | A1* | 3/2018 | Remsburg | H01L 23/467 |
| 2018/0090413 | A1* | 3/2018 | Terasaki | H01L 23/142 |
| 2018/0098458 | A1* | 4/2018 | Chainer | H01L 23/467 |
| 2018/0098459 | A1* | 4/2018 | Chainer | F28F 3/12 |
| 2018/0100710 | A1* | 4/2018 | Chainer | H01L 23/427 |
| 2018/0126322 | A1* | 5/2018 | O'Coin | B01D 53/0446 |
| 2018/0157297 | A1* | 6/2018 | Delano | G06F 1/206 |
| 2018/0200790 | A1* | 7/2018 | Hart | B22F 3/1055 |

(56) References Cited

U.S. PATENT DOCUMENTS

| | | | | |
|---|---|---|---|---|
| 2018/0212289 A1* | 7/2018 | Pinon | ............... | H01M 10/653 |
| 2018/0224213 A1* | 8/2018 | Lee | ............... | F28D 15/0233 |
| 2018/0243858 A1* | 8/2018 | Hori | ............... | H01L 23/473 |
| 2018/0245862 A1* | 8/2018 | Bungo | ............... | F28F 13/08 |
| 2018/0248238 A1* | 8/2018 | Pinon | ............... | H01M 10/6556 |
| 2018/0251878 A1* | 9/2018 | Kadali | ............... | C22F 1/053 |
| 2018/0252486 A1* | 9/2018 | Wang | ............... | F25B 49/02 |
| 2018/0259273 A1* | 9/2018 | Wang | ............... | F25B 49/02 |
| 2018/0283802 A1* | 10/2018 | Bungo | ............... | H05K 7/20254 |
| 2018/0345420 A1* | 12/2018 | Jacoby | ............... | B23K 35/286 |
| 2018/0361501 A1* | 12/2018 | Hardwick | ............... | B23K 20/124 |

FOREIGN PATENT DOCUMENTS

| | | | | | |
|---|---|---|---|---|---|
| DE | 102005035458 A1 | * | 2/2007 | ............... | F24C 15/20 |
| EP | 2679327 A2 | * | 1/2014 | ............... | B23K 1/0012 |
| JP | 09203595 A | * | 8/1997 | | |
| JP | 2005154799 A | * | 6/2005 | | |
| WO | WO-2004011867 A1 | * | 2/2004 | ............... | F28F 3/02 |
| WO | WO-2016194158 A1 | * | 12/2016 | ............... | H01L 23/473 |

OTHER PUBLICATIONS

Vacuum Brazing Techniques and Advantages—AZom (May 12, 2015) (Year: 2015).*

Ultrasonic Consolidation . . . —Ram et al. (May 2007) (Year: 2007).*

International Search Report and Written Opinion for corresponding International Application No. PCT/US2018/025003 dated Jul. 17, 2018.

* cited by examiner

INTEGRATION OF ULTRASONIC ADDITIVE MANUFACTURED THERMAL STRUCTURES IN BRAZEMENTS

FIELD OF THE INVENTION

The invention relates to structures manufactured using ultrasonic additive manufacturing, and more particularly, forming a part with more complex geometries using an ultrasonic additive manufacturing process and permanently joining the part to a brazed structure using a brazing or welding process for increasing thermal performance of the structure.

DESCRIPTION OF THE RELATED ART

Many applications use heating or cooling manifold structures that include sheet-like finstock layers for more efficient heat transfer through the manifold structure by way of convection across the finstock. The manifold structures may be in the form of heat exchangers of may include cold plates. For example, cold plates may be used in applications having electronics that require cooling. Conventionally, cold plates and heat exchangers may be manufactured as brazed structure having pre-fabricated finstock that is dropped into a machined cavity of the brazed structure.

However, using a brazing process may be disadvantageous in forming the finstock layers due to limitations in suitable materials and geometries of the finstock. For example, forming the finstock layers at angles greater than five degrees relative to a horizontal axis may not be possible due to spillage of the filler material used during brazing. Spillage of the filler material may result in failure of the brazed joints. Brazed finstock layers may also be limited in thickness in that thinner layers may be difficult to braze together and more prone to causing spillage of the filler material during brazing. Additionally, dissimilar metal materials may also be difficult to braze together due to varying melting temperatures that may not be suitable for brazing.

Attempts have been made to join casted parts having enhanced thermal features to vacuum brazements. For example, laser powder bed fusion using powder aluminum has been previously used. However, using powder aluminum may be disadvantageous due to different melting points of the cast aluminum and the brazement. For example, the laser powder bed fusion results in a cast aluminum having a melting temperature that is too low to withstand a standard vacuum braze process that uses 6000-series aluminum.

SUMMARY OF THE INVENTION

Ultrasonic additive manufacturing (UAM) is advantageous in forming a manifold structure, such as a heat exchanger or cold plates. A finned heat exchanger provides for more efficient heat transfer. Using UAM to build up layers of finstock enables the finstock to have more complex geometries within the manifold structure. The manifold structure includes a center manifold section that is formed of a metal material and has at least one machined cavity or flow passage. After the finstock layers or finned cavity is formed by UAM, the finned cavity may be permanently joined to the center manifold section by way of a brazing or welding process. Using UAM to form the finstock layers and permanently joining the finstock layers to the center manifold section enables the joining of a casted part with enhanced thermal features to a vacuum brazed structure. The resulting manifold structure has dissimilar metal materials or multi-material laminate materials that are integrated into the center manifold section. The resulting manifold structure may also have bond joints of the finstock layers that are arranged at angles greater than ten degrees relative to a horizontal axis, as compared with using only a brazing process which may result in spillage of the brazing filler material due to different melting points of the cast material and the brazed structure.

The following aspects of the invention may be combinable in any combination.

According to an aspect of the invention, a manifold structure has at least one flow passage. The manifold structure further includes a center manifold section formed of a metal material and having at least one machined cavity in communication with the at least one flow passage. The manifold structure a plurality of finstock layers that are arranged within the flow passage and segment the flow passage into a plurality of flow cavities. The finstock layers are stacked in a direction normal to the center manifold section and permanently joined to the center manifold section. The finstock layers are formed of a multi-material laminate material that is integrated into the metal material of the center manifold section.

According to an aspect of the invention, the finstock layers may be welded or brazed to the center manifold section.

According to an aspect of the invention, the center manifold section may be formed of aluminum.

According to an aspect of the invention, the multi-material laminate material may include an aluminum material.

According to an aspect of the invention, the multi-material laminate material may further include at least one of copper, molybdenum, tungsten, titanium, or silicon carbide.

According to an aspect of the invention, the finstock layers may have bond joints that are arranged at angles greater than ten degrees relative to a horizontal axis.

According to an aspect of the invention, a manifold structure surface may have at least one flow passage. The manifold structure includes a center manifold section that is formed of a metal material and has at least one machined cavity. The manifold structure includes a plurality of finstock layers that are arranged within the flow passage and segment the flow passage into a plurality of flow cavities. The finstock layers are stacked in a direction normal to the center manifold section and permanently joined to the center manifold section. At least one of the finstock layers has a bond joint that is arranged at an angle greater than ten degrees relative to a horizontal axis.

According to an aspect of the invention, the finstock layers may be formed of more than one metal material.

According to an aspect of the invention, the finstock layers may be formed of a multi-material laminate material.

According to an aspect of the invention, the center manifold section may be formed of aluminum.

According to an aspect of the invention, the finstock layers may be formed of aluminum and at least one second material that is embedded within the aluminum.

According to an aspect of the invention, the at least one second material may be copper, molybdenum, tungsten, titanium, or silicon carbide.

According to an aspect of the invention, the manifold structure may be a heat exchanger.

According to an aspect of the invention, the manifold structure may include at least one vacuum brazed cold plate.

According to an aspect of the invention, a method of forming a manifold structure may be used to form a manifold structure having at least one flow passage. The method may include forming a plurality of finstock layers using an ultrasonic additive manufacturing process, forming a center manifold section of a metal material, machining the center manifold section to form at least one cavity, and arranging the plurality of finstock layers within the at least one cavity of the center manifold section to segment the at least one cavity into a plurality of flow cavities. The method may further include permanently joining the plurality of finstock layers to the center manifold section.

According to an aspect of the invention, permanently joining the finstock layers to the center manifold section may include using a brazing process or a welding process.

According to an aspect of the invention, the method may further include forming the plurality of finstock layers of an aluminum material, and vacuum brazing the plurality of finstock layers to the center manifold section using a filler material that is formed of the aluminum material of the finstock layers.

According to an aspect of the invention, forming the plurality of finstock layers may include using dissimilar metal materials or multi-material laminate materials.

According to an aspect of the invention, forming the plurality of finstock layers may include forming a first layer, wherein the first layer is formed of a first metal material, and embedding a second layer within the first layer for heat spreading, wherein the second layer is formed of a second metal material.

According to an aspect of the invention, forming the finstock layers may include arranging bond joints of the finstock layers at angles greater than ten degrees relative to a horizontal axis.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

The principles described herein have particular application in a manifold structure that may be used for heating or cooling a surface to which the manifold structure is attached. The manifold structure may be a heat exchanger. The manifold structure may include cold plates. Cold plates may be used in various applications, such as in military electronics packaging or in any suitable aerospace application for cooling electronics. For example, cold plates may be implemented in radar structures. The manifold structure described herein may be implemented in many other applications. For example, the manifold structure may be used in lightweight armor.

UAM is advantageous in forming manifold structures or parts of manifold structures due to the capabilities of UAM in producing complex internal features within metallic materials. Examples of complex internal features that may be formed by UAM include honeycomb structures, internal pipes or channels, and enclosed cavities. UAM may be advantageous in forming finstock of the manifold structure. The UAM finstock may then be permanently joined to a machined metal part of the manifold structure via a brazing process or a welding process. The manifold structure may be finned for more efficient heat transfer through the manifold structure, by way of convection across the finstock. The finstock may be sheet-like in shape. Using UAM to build up layers of finstock for a cavity or flow passage of the manifold structure allows the layers or sheets of finstock to be stacked in a direction normal to the direction of fluid flow through a corresponding flow passage of the manifold structure. The finstock may also be oriented in a direction normal to the surface to be heated or cooled. The arrangement of the finstock provides more efficient heat transfer through the manifold structure as compared with conventional manifold structures that have vertically-arranged finstock.

Figure 1:
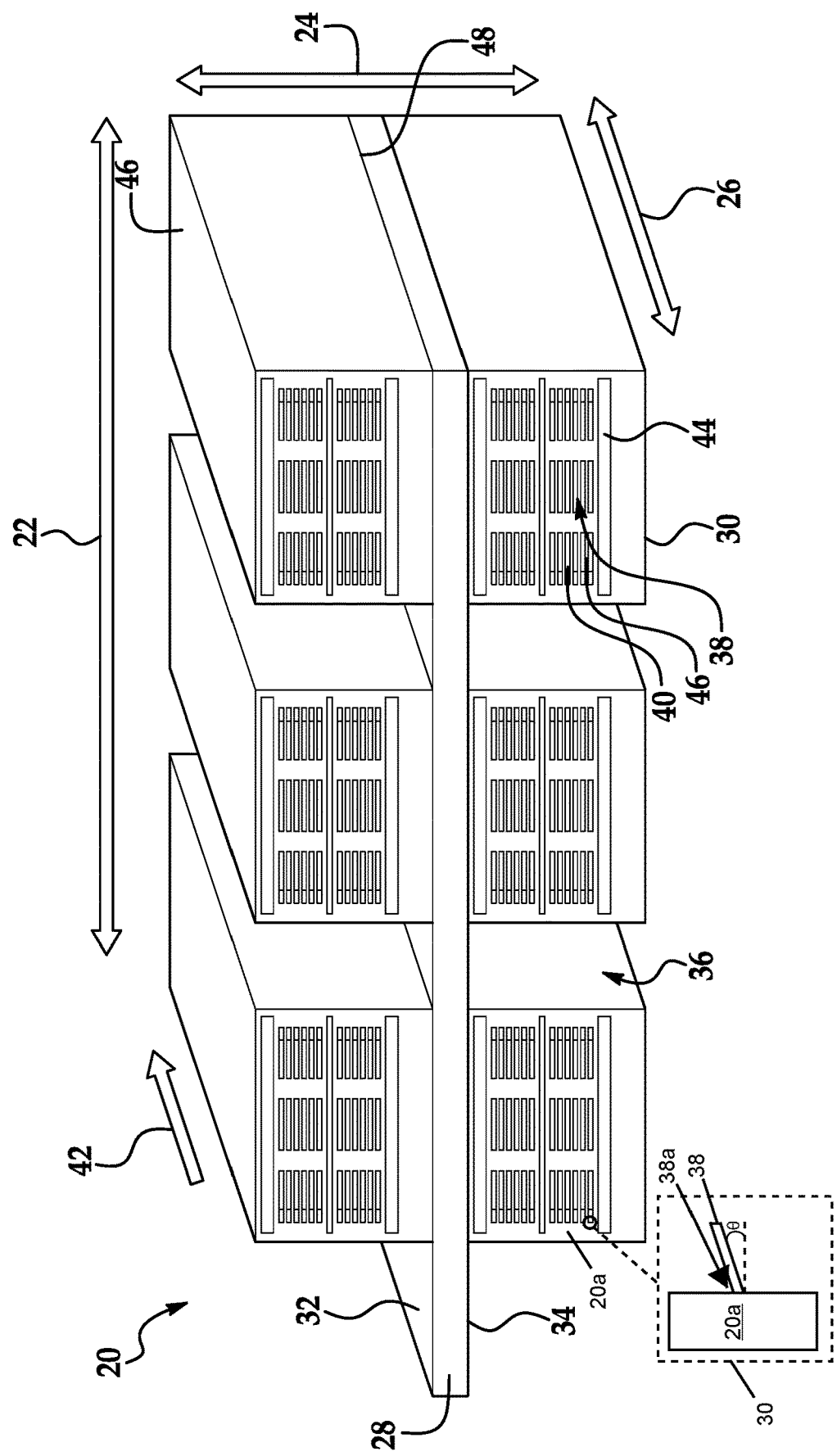
FIG. 1 is a schematic drawing showing an oblique view of a manifold structure.

Referring now to FIG. 1, an exemplary manifold structure 20 is schematically shown. The manifold structure 20 may have a length 22 that extends along a horizontal or x-axis, a height 24 that extends along a vertical or y-axis, and a width 26 that extends perpendicularly to the horizontal axis and the vertical axis, or along a z-axis. The length 22 may be greater than the height 24 and the width 26. The length 22, height 24, and the width 26 of the manifold structure may be dependent on the application. In an exemplary configuration, the manifold structure 20 may have a length 22 of around 50 centimeters (20 inches), although many other lengths are possible. The manifold structure 20 may include at least one flow passage that extends along the length 22 or the width 26 of the manifold structure 20. The manifold structure 20 may include a plurality of flow passages.

The manifold structure 20 may include a main body part, such as a center manifold 28. The center manifold 28 may be formed of metal by any suitable metal forming process. The center manifold 28 may be formed of any suitable metal material, such as aluminum. The center manifold 28 may be formed by a milling, machining, and stamping process. In an exemplary embodiment, the center manifold 28 may be formed of 6000-series aluminum. The center manifold 28 may be rectangular or plate-like in shape and may be elongated along the length 22 of the manifold structure 20. The center manifold 28 may have at least one machined cavity or channel that extends along the length 22 or the width 26 of the manifold structure 20. The height and the width of the center manifold 28 may be less than the length of the center manifold 28 and the height may be less than the width. Fluid may flow through the structure 20 by way of the cavity or channel.

The manifold structure 20 may include at least one unit cell 30 that is permanently adjoined to the center manifold 28. The manifold structure 20 may include a plurality of unit cells that are adjoined to a top surface 32 of the center manifold 28 and a plurality of unit cells that are permanently joined to a bottom surface 34 of the center manifold 28. The unit cells may extend vertically from the center manifold 28 and may be arranged horizontally along the center manifold 28. The unit cells that are arranged on a corresponding side of the center manifold 28 may be spaced by a gap 36. Each unit cell 30 may include flow passages that contain finstock 38. The finstock 38 may be provided for structural integrity of the manifold structure 20 and providing an extended surface area for heat transfer through the flow passages of the manifold structure 20. The finstock 38 may be generally square-shaped. The finstock 38 may be relatively thin and in an exemplary embodiment, the finstock 38 may have a thickness between 0.0025 centimeters (0.0010 inches) and 0.0381 centimeters (0.0150 inches). The fin sheets or finstock 38 is arranged in vertical stacks 40 relative to a flow direction 42 of heat travel through the manifold structure 20. The flow direction 42 may be in the direction of the z-axis or width 26 of the manifold structure 20.

Each unit cell 30 may include a plurality of vertical stacks 40 of finstock 38. The vertical stacks 40 may be spaced in both a horizontal and vertical direction such that the stacks 40 form a plurality of rows and columns of finstock 38. As shown in the exemplary configuration of FIG. 1, the manifold structure 20 may include six unit cells and each unit cell 30 may include six stacks of finstock 38. Each unit cell 30 may further include internal layers 44 that are disposed between rows of the vertical stacks 40 of finstock 38. The internal layers 44 may extend along the length 22 of each unit cell 30. The internal layers 44 may be used for enhanced heat spreading through the flow passage of the manifold structure 20. For example, each unit cell 30 may include three internal layers that separate two rows of vertical stacks 40 of finstock 38.

The finstock 38 may be interposed between flat metal separator plates 46, 48. The sheets of finstock 38 are arranged horizontally, or in a direction normal to the direction of heat flow through the manifold structure 20, providing for a shorter and more direct path of heat travel relative to the heat travel path of the prior art where the finstock is arranged vertically. The finstock 38 may be arranged in a direction normal to the surface to be heated or cooled (not shown). The flow passages of the manifold structure 20 may extend in a longitudinal direction and in a transverse direction. The layers of finstock 38 may extend through the flow passages and define cavities 46 between each layer to enable flow through the respective flow passage. The flow passage may be segmented by the finstock 38 such that each cavity 46 forms a sub-flow passage through the larger flow passage. As shown in FIG. 1, the sub-flow passages may extend in the flow direction 42, or along the width 26 of the manifold structure 20. The finstock 38 may have bond joints 38a which may be defined as the points of contact between the sheets of finstock 38 and vertically extending support walls 20a of the corresponding unit cell 30.

In an exemplary configuration where the manifold structure is a heat exchanger, the finstock 38 is configured to increase heat transfer from the heated surface to which the manifold structure 20 is attached, via the surface area of the finstock 38. The finstock 38 enables heat flow through the manifold structure 20 by way of convection. The finstock 38 accommodates for reduction in temperature potential between the finstock 38 and the ambient fluid due to conduction along the finstock 38 and convection from or to the surface of the finstock 38. The fin efficiency is dependent on fin geometry, fin material thermal conductivity, and a heat transfer coefficient at the fin surface. Arranging the finstock 38 normal to the surface effectively changes the geometry of the fin, by providing a more direct heat transfer path through the heat exchanger.

Figure 2:
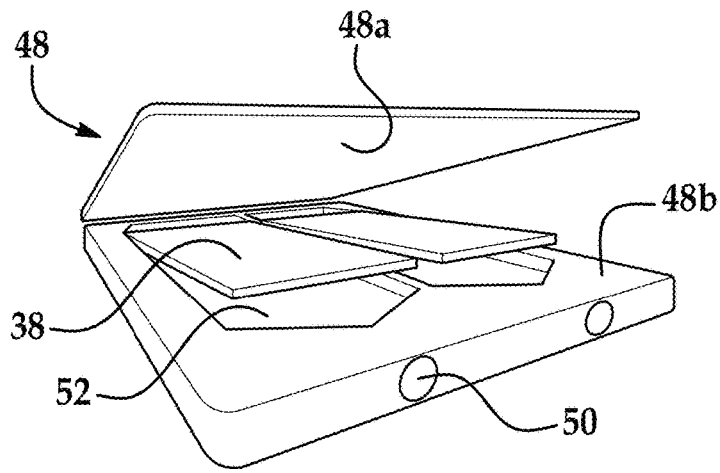
FIG. 2 is a drawing showing an oblique view of a cold plate having finstock.

Referring in addition to FIG. 2, an exemplary configuration of the manifold structure may be a cold plate structure 48 used for military electronics packaging. The cold plate structure 48 may include a plurality of machined aluminum plates 48a, 48b that are vertically stacked. The plate 48b may have at least one milled channel 50 that extends along the length of the plate 48b. The plate 48b may also have a milled recess 52 that is in communication with the milled channel 48 for receiving layers of finstock 38 that segment the flow passage into a plurality of flow passages. The finstock 38 may be pre-manufactured and permanently joined into the milled recess 52. The finstock 38 may be formed by any suitable additive manufacturing process, such as UAM or electron beam melting. Using UAM to form the finstock 38 may be advantageous in that UAM enables the finstock 38 to be formed of dissimilar metal materials or multi-material laminate materials, as compared with conventional manifold structures that are limited to a single material due to different melting temperatures of materials at brazing temperatures. Furthermore, the finstock 38 formed of UAM may also be advantageous in that the bond joints 38a (FIG. 1) of the finstock 38 may be arranged at off-angle geometries, such as angles 8 greater than ten degrees relative to the horizontal axis (FIG. 1).

Conventionally, top and bottom sections of the manifold structure may be machined as shells and the finstock may be laser trimmed to fit into each shell with braze material. However, brazing the finstock layers into the cavities of the manifold structure may be disadvantageous due to the restraint of the geometries of the finstock layers. Using conventional method to form the finstock layers may prevent the finstock layers from being angled more than five or ten degrees relative to the horizontal axis due to gravity and spillage of the filler material at the temperatures required for brazing. Spillage of the filler material may result in finstock layers being offset or non-uniformly formed. For example, joining additive manufactured aluminum parts using laser powder bed fusion may produce an aluminum material having a melting temperature that is too low to withstand the 6000-series aluminum material that is used in standard vacuum brazes. In contrast, for example, UAM enables the aluminum plates 48a, 48b to be formed of a 6000-series aluminum and the finstock material to be formed of 1100-series aluminum that has a lower melting temperature as compared with the 6000-series aluminum. Brazed finstock that is formed of a metal other than the base metal of the structure may also cause the yield strength of the brazed finstock to be less than that of the base metal. The lesser yield strength of the brazed finstock may result in bowing or deformation of the brazed finstock layers formed over the cavity.

Using UAM enables finstock formed of dissimilar metal materials to be permanently joined to the cold plates as compared with using the conventional brazing process during which the 1100-series aluminum would spill out of the milled recess 52. Forming the finstock by UAM enables material properties of the base material of the finstock to be maintained. UAM enables forming the finstock by welding of dissimilar metals and multi-material laminates, such that multiple metal foils may be combined. Materials that may be suitable for forming the finstock using UAM include aluminum, copper, molybdenum, tungsten, titanium, and silicon carbide. Many other materials may be suitable. Other suitable metal materials for the UAM process may include beryllium, gold, iron, nickel, platinum, tantalum, and zirconium. Alloys of aluminum, copper, gold, iron, nickel and platinum may also be suitable. The material may include a ceramic-fiber reinforced metal matrix material. It should be recognized that the maximum width of a cavity in the part may be dependent on the material of the part. For example, the maximum width of an unsupported cavity in an H18 aluminum part may be between 0.200 inches and 0.240 inches due to lower tensile strengths and hardness properties as compared with other aluminum alloys. For increasing the maximum width of the unsupported cavity to greater than 0.250 inches, aluminum alloys or other materials having tensile strengths between 130 and 390 megapascals or a Brinell hardness number greater than 35 may be suitable. In an exemplary embodiment, an aluminum alloy such as 6061-T6 may be used.

Figure 3:
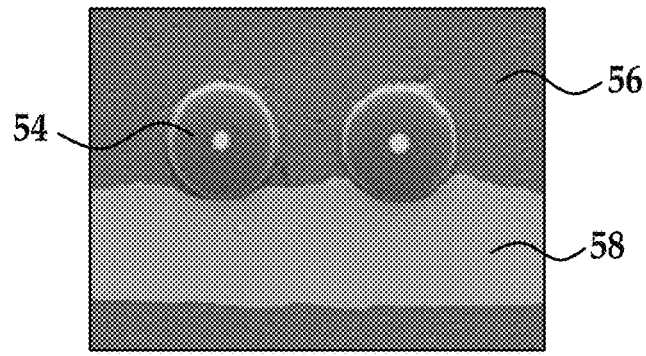
FIG. 3 is a drawing showing a scanning electronic microscope image of a part formed by an ultrasonic additive manufacturing (UAM) process.

Multi-material laminates may be formed of dissimilar metal materials and integrated into an aluminum brazement of the manifold structure. For example, suitable multi-material laminates for the finstock may include a laminate formed of copper and molybdenum, copper and aluminum, copper and tungsten, or aluminum and silicon carbide. With reference to FIG. 3 which shows a scanning electron microscope image of a multi-material laminate used for the finstock 38 (FIG. 1) of the manifold structure, UAM may be used to integrate a silicon carbide material 54 into an aluminum base material 56. As also shown in FIG. 3, a copper material 58 may be used as the internal layer or heat spreading layer 44 (FIG. 1). Many other materials may be suitable for forming the heat spreading layer.

Figure 4:
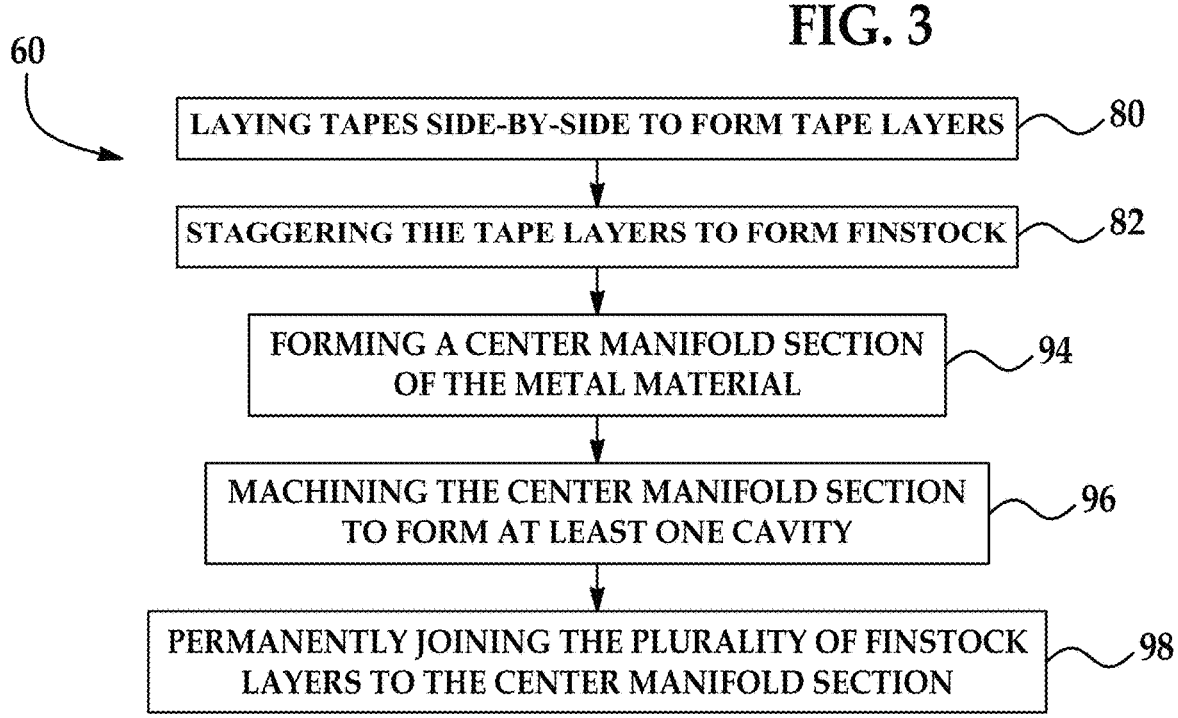
FIG. 4 is a flow chart illustrating a method of forming the manifold structure of FIG. 1.
Figure 5:
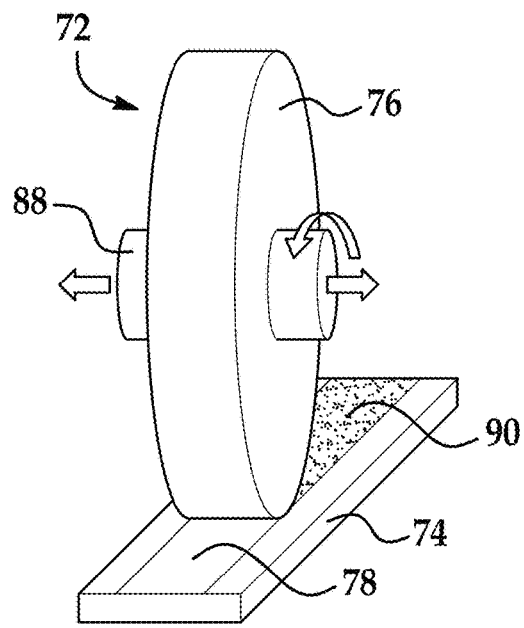
FIG. 5 is a schematic drawing showing an oblique view of a system for performing a UAM process.
Figure 6:
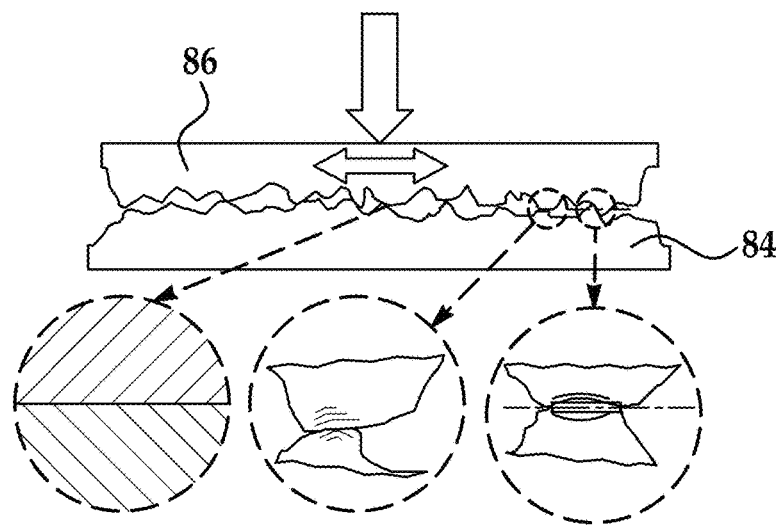
FIG. 6 is a schematic drawing showing an oblique view of metal tape layers that are merged together during the UAM process.
Figure 7:
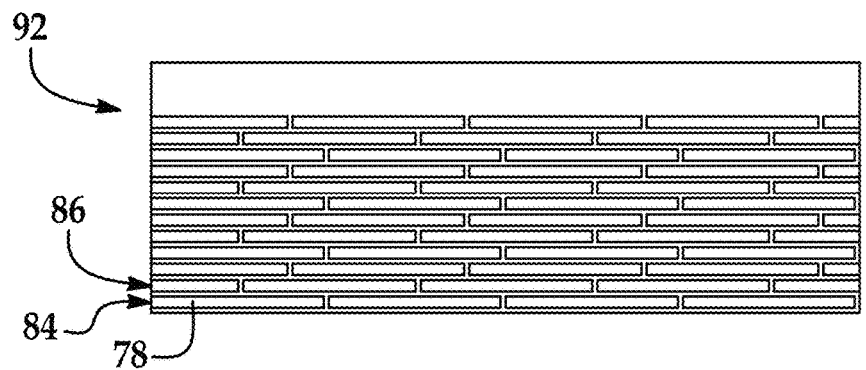
FIG. 7 is a schematic drawing showing a build-up of tape layers during the UAM process.

Referring in addition to FIGS. 4-7, a method and system for forming the manifold structure 20 (FIG. 1) are schematically illustrated. FIG. 4 is a flow chart illustrating a method 60 of forming the manifold structure 20. FIGS. 5-7 are schematic drawings illustrating the system used to form the manifold structure 20. The method 60 includes using UAM to build the layers of finstock 38 (FIG. 1). FIG. 5 is a schematic drawing of a UAM machine 72. The UAM process may be used to build up the finstock 38 or finned cavities on a base plate 74 that is an existing part or a portion of an existing structure. The base plate 74 may be a heated substrate having a temperature in a range from near ambient room temperature up to 200 degrees Celsius. The UAM machine 72 includes a rotatable sonotrode 76 that travels along a length of a thin metal foil, or tape 78. The tape 78 may have a width between 100 and 150 microns and a thickness between 1.25 centimeters (0.5 inches) and 3.80 centimeters (1.5 inches). The sonotrode 76 is used to apply a force normal to the tape 78 to hold the tape 78 to the base plate 74 or another tape.

The method 60 of forming the manifold structure 20 (FIG. 1) may include forming the plurality of layers of finstock 38 (FIG. 1) using an additive manufacturing process. Forming the plurality of layers of finstock 38 may include using a UAM process, electron beam melting, or any other suitable additive manufacturing process. Forming the plurality of layers of finstock 38 may include using dissimilar metal materials or multi-material laminate materials. In an exemplary UAM process, step 80 of the method 60 includes laying the tapes 78 side-by-side to form a tape layer. Step 80 is repeated to form a plurality of tape layers. Step 80 may include forming a first layer 56 (FIG. 3) of a first metal material 56 (FIG. 3), such as aluminum, and embedding a second layer 58 (FIG. 3) of a second metal material, such as copper, within the first layer. The second metal material may be used as a heat spreading material for enhanced thermal properties of the part.

After a tape layer is formed, step 82 includes staggering the tape layers to form a homogenous structure that does not contain gaps between the tapes. The process may be repeated to form each of the layers of finstock 38 and cavities 46 (FIG. 1) between the layers. Step 82 may further include arranging the finstock layers at angles greater than ten degrees relative to the horizontal axis of the manifold structure 20. Referring in addition to FIG. 6, a schematic drawing of the merging or welding of tape layers 84, 86 is shown. The sonotrode 76 may include transducers 88 that produce vibrations to oscillate the sonotrode 76 transversely to the direction of rotation of the sonotrode 76. The sonotrode 76 may oscillate at a constant frequency, around 20 kilohertz, to break oxide layers on the tapes of the tape layers 84, 86 to be adjoined to form a bonded or welded tape 90. FIG. 7 shows the tapes 78 laid side-by-side to form the layers 84, 86. The layers 84, 86 are stacked such that the tapes 78 of each layer are staggered. Each layer is welded or merged to a previously formed layer, such that the homogeneous structure 92 is formed by building up the layers.

Before or after the homogeneous part or solid structure 92 is formed by the UAM process, step 94 includes forming the center manifold section 28 (FIG. 1) of a metal material. Step 94 may include any suitable metal forming process and may include milling and stamping. After the center manifold section 28 is formed, step 96 of the method 60 includes further machining the center manifold section 28 to form at least one cavity 50 (FIG. 2), milled recess 52 (FIG. 2) or other flow passages. The cavity may be formed by computer numerical control (CNC) machining or milling. CNC machining may be used to mill or trim the upward-facing surface of the plate 48b (FIG. 2) to form the cavity 52 (FIG. 2). The CNC machining may include using a conical tool or a ball nose cutter to vertically mill into the plate 48b.

After the center manifold section 28 is formed, step 98 of the method 60 includes permanently joining the plurality of layers of finstock 38 to the center manifold section 28. Before the layers of finstock 38 are permanently joined to the center manifold section 28, the finstock 38 may be arranged within the machined cavity of the center manifold section 28 to segment the cavity into a plurality of flow cavities. Permanently joining the layers of finstock 38 to the center manifold section 28 may include using a vacuum brazing process or a welding process. UAM and the vacuum brazing process may use the same 6000-series aluminum material. Other permanent joining processes may be suitable depending on the melting points of the materials used. Using both a UAM process and a brazing process enables more complex parts to be created using UAM and combined in a lower cost brazing process to form the manifold structure.

Using UAM, the finstock layers are arranged to optimize heat transfer through the manifold structure, such as in a direction normal to the heated surface. Increasing efficiency of the cooling function performed by the manifold structure allows for improved thermal performance of manifold structures used for cooling high power electronics. Applications requiring cooling manifolds may implement fewer manifolds, given the increased efficiency of the manifold structure according to the present application. Providing fewer manifold structures decreases power used to pump coolant through the manifolds, effectively reducing the overall operating costs of the electronics and associated cooling manifold structure. In aerospace applications such as radars, the manifold structure according to the present application may be implemented to allow radars to operate at a higher energy level due to the improved detection of the radar by increased efficiency of cooling the circuitry.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A manifold structure having at least one flow passage, the manifold structure comprising:
   a center manifold section formed of a single metal material and having at least one machined cavity in communication with the at least one flow passage; and
   a plurality of ultrasonic additively manufactured finstock layers that are arranged within the flow passage and segment the flow passage into a plurality of flow cavities,
   wherein the finstock layers are stacked in a direction normal to the center manifold section and permanently joined to the center manifold section, the finstock layers being vacuum brazed to the center manifold section, and
   wherein the finstock layers are formed of a multi-material laminate material having dissimilar metal materials that is integrated into the single metal material of the center manifold section and
   wherein each of the finstock layers has a bond joint that is a point of contact between a sheet of the respective finstock layer and a vertically extending support wall of the manifold structure, wherein the bond joint of at least one of the finstock layers is arranged at an angle greater than ten degrees relative to a horizontal axis of the manifold structure.

2. The manifold structure of claim 1, wherein the dissimilar metal materials includes at least one material that is a same material as the single metal material of the center manifold section.

3. The manifold structure of claim 2, wherein the same material is an aluminum material.

4. The manifold structure of claim 3, wherein the multi-material laminate material further includes at least one of copper, molybdenum, tungsten, titanium, or silicon carbide.

5. The manifold structure of claim 1, wherein the center manifold section is formed of aluminum.

6. The manifold structure of claim 1, wherein the finstock layers are formed of aluminum and at least one second material that is embedded within the aluminum.

7. The manifold structure of claim 6, wherein the at least one second material is copper, molybdenum, tungsten, titanium, or silicon carbide.

8. The manifold structure of claim 1, wherein the manifold structure is a heat exchanger.

* * * * *